(12) United States Patent
Zhai et al.

(10) Patent No.: US 10,905,032 B2
(45) Date of Patent: Jan. 26, 2021

(54) SYSTEM AND METHOD FOR HEAT DISSIPATION OF STORAGE DEVICE USING MOVABLE FANS

(71) Applicant: EMC IP Holding Company LLC, Hopkinton, MA (US)

(72) Inventors: Haifang Zhai, Shanghai (CN); Hendry Wu, Shanghai (CN); David Dong, Shanghai (CN); Yujie Zhou, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 221 days.

(21) Appl. No.: 16/172,055

(22) Filed: Oct. 26, 2018

(65) Prior Publication Data
US 2019/0174657 A1    Jun. 6, 2019

(30) Foreign Application Priority Data

Oct. 27, 2017    (CN) .......................... 2017 1 1023166

(51) Int. Cl.
*G05B 15/02*    (2006.01)
*H05K 7/20*    (2006.01)
(Continued)

(52) U.S. Cl.
CPC ....... *H05K 7/20836* (2013.01); *F04D 25/166* (2013.01); *F04D 27/004* (2013.01);
(Continued)

(58) Field of Classification Search
CPC . H05K 7/20836; H05K 7/20736; F24F 11/77; F24F 11/79; F24F 11/0001;
(Continued)

(56) References Cited

U.S. PATENT DOCUMENTS 7,414,805 B1    8/2008 Ochs et al.
7,864,530 B1    1/2011 Hamburgen et al.
(Continued)

FOREIGN PATENT DOCUMENTS

CN    101472446 A    7/2009
CN    101865152 A    10/2010
(Continued)

OTHER PUBLICATIONS

English translation of Guo et al. Chinese Patent Document CN 10653557 (published Mar. 22, 2017).*

*Primary Examiner* — Bernard G Lindsay
(74) *Attorney, Agent, or Firm* — Ryan, Mason & Lewis, LLP

(57) ABSTRACT

Embodiments of the present disclosure provide a system and method for heat dissipation of a storage device. The system comprises a guiding rail mounted in an enclosure of the storage device; a set of fans arranged on the guiding rail and being movable on the guiding rail, the set of fans being configured to dissipate heat of a disk assembly of the storage device; and a controller configured to: obtain a temperature of the disk assembly at a first time point; and in response to the temperature of at least one disk in the disk assembly exceeding a threshold temperature, perform at least one of the following: adjusting a position of at least one of the set of fans; and increasing a rotational speed of at least one of the set of fans.

20 Claims, 11 Drawing Sheets

(51) Int. Cl.
*F04D 27/00* (2006.01)
*F04D 29/60* (2006.01)
*G11B 33/14* (2006.01)
*F24F 11/00* (2018.01)
*F24F 11/77* (2018.01)
*F04D 25/16* (2006.01)
*F24F 11/79* (2018.01)
*F24F 11/76* (2018.01)
*F24F 11/74* (2018.01)

(52) U.S. Cl.
CPC ........ *F04D 29/602* (2013.01); *F24F 11/0001* (2013.01); *F24F 11/77* (2018.01); *F24F 11/79* (2018.01); *G05B 15/02* (2013.01); *G11B 33/142* (2013.01); *H05K 7/20736* (2013.01); *F24F 11/74* (2018.01); *F24F 11/76* (2018.01)

(58) Field of Classification Search
CPC ......... F24F 11/74; F24F 11/76; F04D 25/166; F04D 27/004; F04D 29/602; G05B 15/02; G11B 33/142
See application file for complete search history.

(56) References Cited

U.S. PATENT DOCUMENTS

| | | | |
|---|---|---|---|
| 9,534,612 | B2 | 1/2017 | Wu et al. |
| 9,760,098 | B1 | 9/2017 | Imwalle et al. |
| 10,575,435 | B2 | 2/2020 | Zhai et al. |
| 10,729,035 | B2 | 7/2020 | Zhai et al. |
| 2003/0234624 | A1 | 12/2003 | Frankel et al. |
| 2005/0018399 | A1 | 1/2005 | Shimizu |
| 2007/0281639 | A1 | 12/2007 | Clidaras et al. |
| 2009/0168324 | A1* | 7/2009 | Lai ................... H05K 7/20209 361/679.33 |
| 2009/0195629 | A1 | 8/2009 | Yamada et al. |
| 2009/0249862 | A1 | 10/2009 | Glover et al. |
| 2011/0054705 | A1 | 3/2011 | Vaidyanathan et al. |
| 2011/0242759 | A1* | 10/2011 | Lu ................... H05K 7/20172 361/695 |
| 2012/0074121 | A1 | 3/2012 | Gagas et al. |
| 2012/0215359 | A1* | 8/2012 | Michael ................ G06F 1/206 700/275 |
| 2013/0229765 | A1* | 9/2013 | Weng ................ H05K 7/20209 361/679.33 |
| 2013/0248140 | A1 | 9/2013 | Haigh |
| 2014/0014292 | A1 | 1/2014 | Rice et al. |
| 2014/0111939 | A1* | 4/2014 | Lin ................... H05K 7/20836 361/695 |
| 2014/0226280 | A1* | 8/2014 | Alshinnawi ........ H05K 7/20145 361/679.49 |
| 2015/0060014 | A1* | 3/2015 | Ma .................... H05K 7/20736 165/80.2 |
| 2015/0377244 | A1 | 12/2015 | Stanko et al. |
| 2016/0088766 | A1 | 3/2016 | Bell et al. |
| 2016/0363901 | A1 | 12/2016 | Arakawa |
| 2017/0034945 | A1 | 2/2017 | Pronozuk et al. |
| 2017/0156238 | A1 | 6/2017 | Li |
| 2017/0242463 | A1 | 8/2017 | Matteson et al. |
| 2018/0310437 | A1* | 10/2018 | Anderl ............. H05K 7/20172 |
| 2019/0223321 | A1 | 7/2019 | Zhai et al. |
| 2019/0235592 | A1 | 8/2019 | Huang et al. |
| 2019/0361508 | A1 | 11/2019 | Yarragunta et al. |
| 2020/0154601 | A1 | 5/2020 | Zhai et al. |

FOREIGN PATENT DOCUMENTS

| | | |
|---|---|---|
| CN | 104423480 A | 3/2015 |
| CN | 205788082 U | 12/2016 |

* cited by examiner

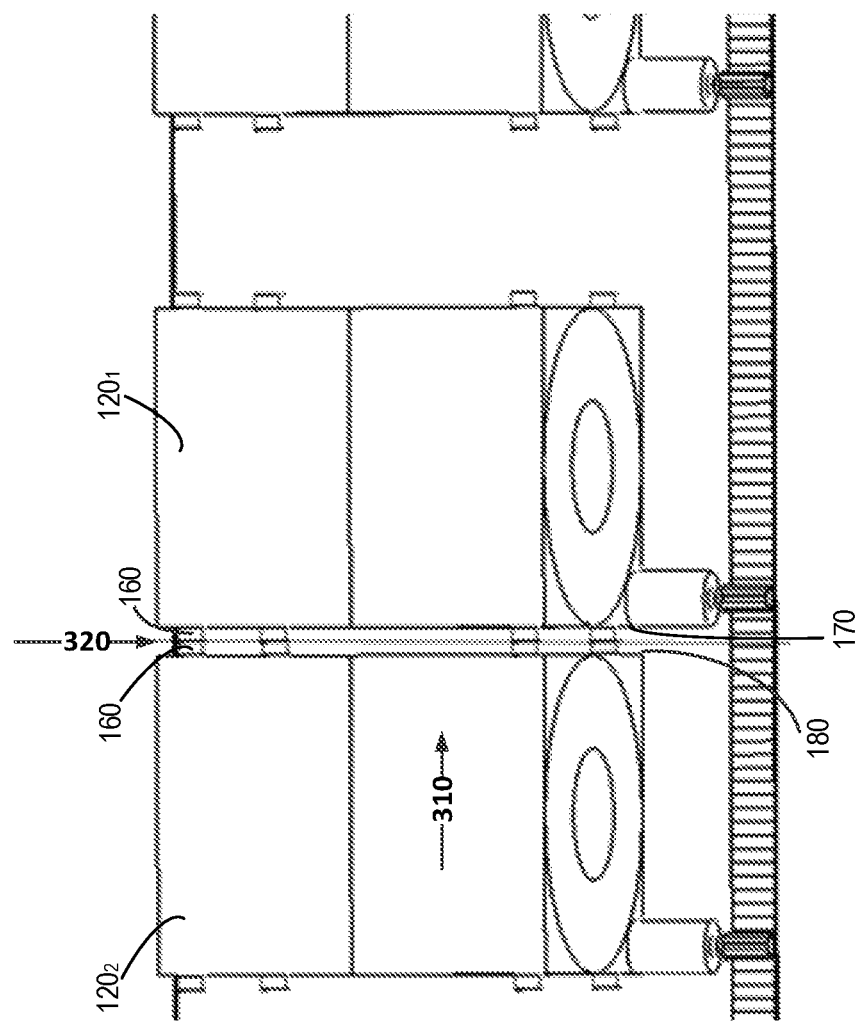

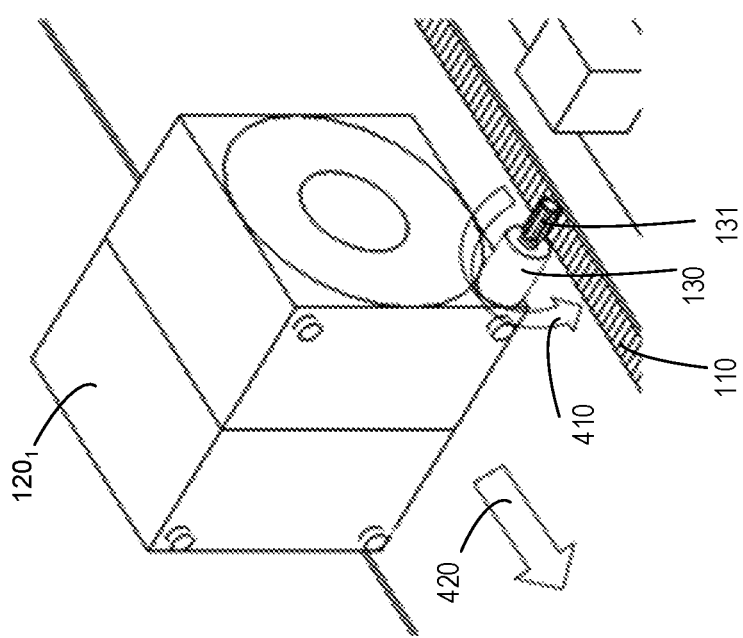

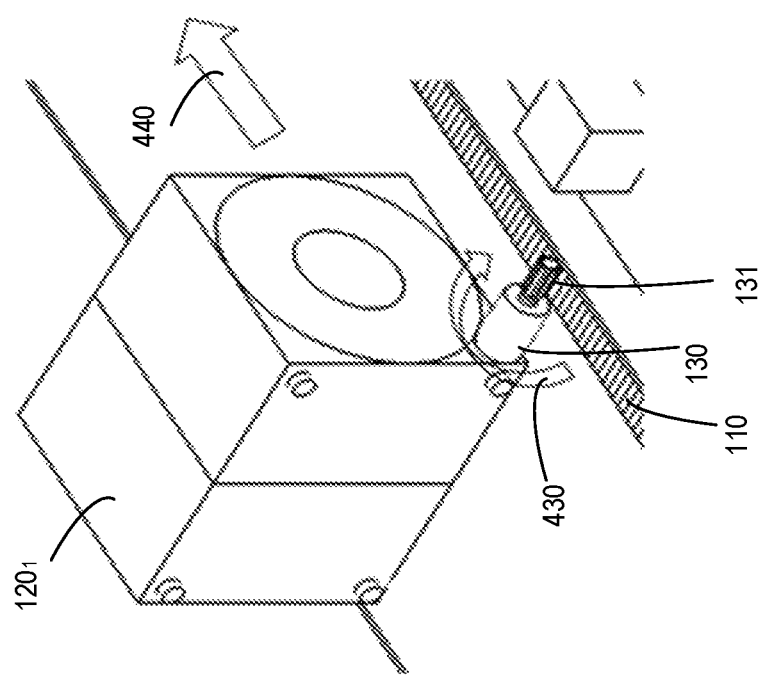

SYSTEM AND METHOD FOR HEAT DISSIPATION OF STORAGE DEVICE USING MOVABLE FANS

RELATED APPLICATIONS

This application claims priority to Chinese Patent Application Number CN 201711023166.5, filed on Oct. 27, 2017 at the State Intellectual Property Office, China, titled "SYSTEM AND METHOD FOR THE HEAT DISSIPATION OF THE STORAGE DEVICE" the contents of which are incorporated herein by reference in their entirety.

FIELD

The present disclosure relates to storage devices, and more specifically, to a system and method for heat dissipation of a storage device.

BACKGROUND

During the use of a conventional chassis that accommodates multi-row disk assemblies, a system for heat dissipation usually can meet the heat dissipation requirements when the disk assemblies operate normally. However, in some particular conditions (e.g., the fault occurs in the fans of partial disk assembly in service mode, one of PSUs in service mode and some specific system), temperature of a part of the affected disk assemblies will significantly increase while other unaffected disk assemblies will still be at a low temperature. Therefore, the requirement of improving balance cooling capability of the system and further increasing the safe operating time under certain conditions has been proposed.

SUMMARY

Embodiments of the present disclosure provide a system and method for heat dissipation of a storage device.

In a first aspect of the present disclosure, there is provided a system for heat dissipation for a storage device. The system comprises: a guiding rail mounted in an enclosure of the storage device; a set of fans arranged on the guiding rail and being movable on the guiding rail, the set of fans being configured to dissipate heat of a disk assembly of the storage device; and a controller configured to: obtain a temperature of the disk assembly at a first time point; and in response to the temperature of at least one disk in the disk assembly exceeding a threshold temperature, perform at least one of the following: adjusting a position of at least one of the set of fans; and increasing a rotational speed of at least one of the set of fans.

In a second aspect of the present disclosure, there is provided a method for heat dissipation for a storage device. The method comprises: obtaining a temperature of a disk assembly of the storage device at a first time point; and in response to the temperature of at least one disk in the disk assembly exceeding a threshold temperature, performing at least one of the following for a set of fans: adjusting a position of at least one of the set of fans; and increasing a rotational speed of at least one of the set of fans; wherein the set of fans are arranged on a guiding rail mounted in an enclosure of the storage device and is are movable on the guiding rail, the set of fans being configured to dissipate the heat of the disk assembly of the storage device.

The Summary is to introduce a selection of concepts in a simplified form that are further described below in the Detailed Description. This Summary is not intended to identify key features or essential features of the present disclosure, nor is it intended to be used to limit the scope of the present disclosure.

BRIEF DESCRIPTION OF THE DRAWINGS

Through the following detailed description with reference to the accompanying drawings, the above and other objectives, features, and advantages of example embodiments of the present disclosure will become more apparent. Several embodiments of the present disclosure will be illustrated by way of example but not limitation in the drawings in which:

FIG. 3 illustrates a schematic diagram of an anti-collision component of a fan according to embodiments of the present disclosure;

FIGS. 4A and 4B illustrate exemplary schematic diagrams of the movement of a fan according to embodiments of the present disclosure;

DETAILED DESCRIPTION OF EMBODIMENTS

Principles of the present disclosure will now be described with reference to some example embodiments. It is to be understood that these embodiments are described only for the purpose of illustration and help those skilled in the art to understand and implement the present disclosure, without suggesting any limitations as to the scope of the disclosure. The disclosure described herein can be implemented in various manners other than the ones described below.

As used herein, the singular forms "a", "an" and "the" are intended to include the plural forms as well, unless the context clearly indicates otherwise. The term "includes" and its variants are to be read as open terms that mean "includes, but is not limited to." The term "based on" is to be read as "based at least in part on." The term "one embodiment" and "an embodiment" are to be read as "at least one embodiment." The term "another embodiment" is to be read as "at least one other embodiment." The terms "first," "second," and the like may refer to different or same objects. Other definitions, explicit and implicit, may be included below.

During the use of a conventional chassis that accommodates multi-row disk assemblies, a system for heat dissipation usually can meet the heat dissipation requirements when the disk assemblies operate normally. However, in some particular conditions (e.g., the fault occurs in the fans of partial disk assembly in service mode, one of PSUs in service mode and some specific system), temperature of a part of the affected disk assemblies will significantly increase while other unaffected disk assemblies will still be at a low temperature. Since the position of a conventional fan or other cooling device for cooling these components inside the chassis is fixed, targeted cooling of the internal components of the chassis that are hot or faulty cannot be performed. In this case, it is expected to improve the balance cooling capability of the system and increase the safe operating time under certain conditions.

Therefore, there is provided a system for heat dissipation of a storage device in accordance with the present disclosure, which can perform adaptive cooling on assemblies inside the heating or faulted chassis, for example, by changing the position of the fan to make it closer to the heating assembly, or increasing cooling air provided in a direction towards the heating assembly etc.

Figure 1:
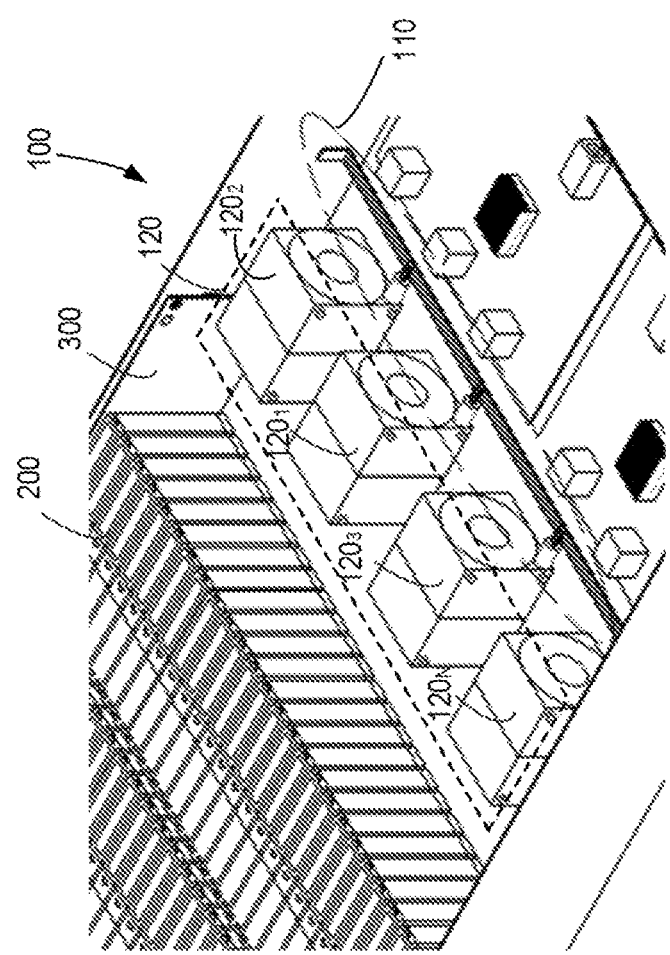
FIG. 1 illustrates an exemplary schematic diagram of a system for heat dissipation according to embodiments of the present disclosure.

FIG. 1 illustrates an exemplary schematic diagram of a system for heat dissipation according to embodiments of the present disclosure. The system for heat dissipation 100 includes a guiding rail 110 and a set of fans 120 arranged on the guiding rail 110 according to embodiments of the present disclosure. In an example shown in FIG. 1, this set of fans includes a first fan $120_1$, a second fan $120_2$, a third fan $120_3$ and a fourth fan $120_N$. It should be noted that the number and position relationship of the fans described here are only exemplary and are not intended for restricting the scope of the present disclosure in any manner. The heating system 100 can include a random number of fans, which can be arranged according to any suitable position relationships.

In the example shown in FIG. 1, the guiding rail 110 is mounted in an enclosure 300 for accommodating the storage device (such as disk assembly 200) and other electronic devices. It should be understood that the enclosure 300 can be any housings for accommodating or carrying storage device, heat dissipation device or other possible electronic components, such as chassis, disk box and the like.

The fans 120 may each be configured to direct heat generated by the disk assembly 200 outside the enclosure 300 to cool the disk assembly 200, and the fans 120 are also configured to be movable on the guiding rail 110.

In the example shown in FIG. 1, the first fan $120_1$, the second fan $120_2$, the third fan $120_3$ and the fourth fan $120_N$ may be equally distributed on the guiding rail 110 when they are located at the at an initial position of the guiding rail 110. For example, the fans are spaced from each other at an equal distance, so as to uniformly dissipate the heat of the disk assembly 200. Again, although four fans disposed on one guiding rail 110 are shown in FIG. 1, the number of rails and the number of fans disposed on the rails may be based on actual needs (such as quantity of disk assemblies in need of cooling, chassis size and the like) and make any modifications.

The system for heat dissipation 100 in the example shown in FIG. 1 also includes a controller. Although the controller is not shown in FIG. 1, it should be understood that the controller may be, for example, a universal control circuit device internal to the storage device, such as a Baseboard Management Controller (BMC), or may be other control devices integrated on the universal control circuit arrangement inside the storage device.

Figure 2:
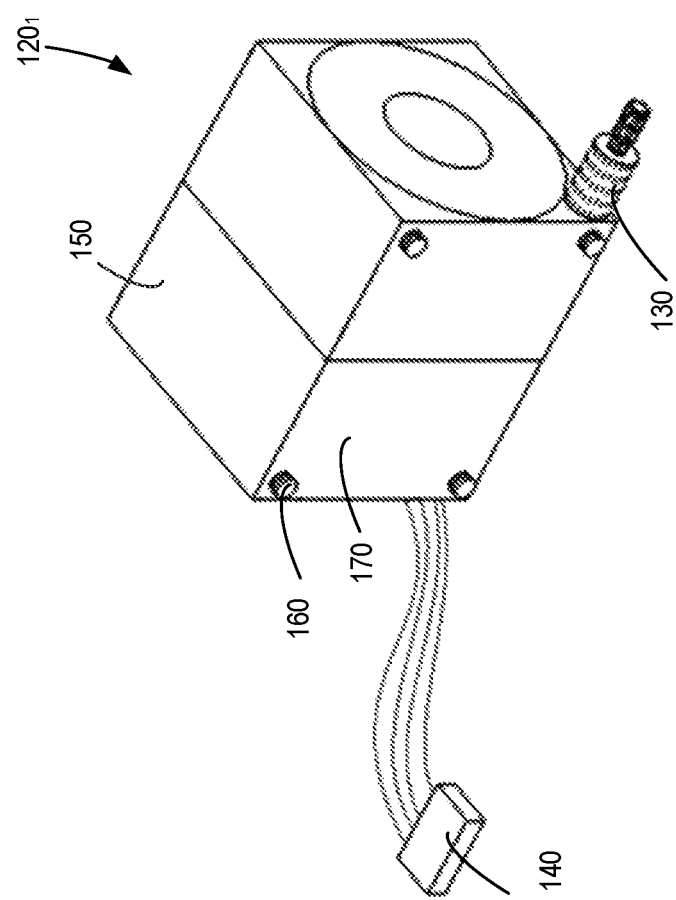
FIG. 2 illustrates an exemplary schematic diagram of a fan according to embodiments of the present disclosure.

FIG. 2 illustrates an exemplary schematic diagram of a fan according to embodiments of the present disclosure. A more detailed schematic diagram of the first fan $120_1$ is demonstrated in FIG. 2. It should be appreciated that the second fan $120_2$, the third fan $120_3$ and the fourth fan $120_N$ can be identical or similar in structure to the first fan $120_1$, and all the structure, functions and other characteristics of the first fan $120_1$ described below may also be applied to the second fan $120_2$, the third fan $120_3$ and the fourth fan $120_N$. However, one or more of these fans may also have different structures and/or mechanisms.

The first fan $120_1$ in FIG. 2 includes a fan main body 150 and an electric motor 130 and a signal connector 140 mounted on the fan main body 150. In some embodiments, the electric motor 130 may be a stepper motor. Other electric motors may also be used. For the sake of convenience of discussion, an example embodiment will be described below by taking a stepping motor as an example.

As a stepper motor, the electric motor 130 is configured to drive the first fan $120_1$ when the signal connector 140 receives a signal, to change the position of the first fan $120_1$ or increase the rotational speed of the first fan $120_1$. The signal connector 140 may be, for example, an electrical line connected to a backplate (not shown) etc. By connecting to the backplate, the signal connector 140 may receive the signal from the baseboard management controller, so as to adjust position and/or rotational speed of the first fan $120_1$. In other words, the received signal may indicate the step number of movement by the electric motor 130 of the first fan $120_1$. The movement process executed by the electric motor 130 of the first fan $120_1$ in response to receiving the control signal will be described in detail below.

Besides, the received signal may also indicate increasing rotational speed of the first fan $120_1$.

As shown in FIG. 2, the first fan $120_1$ may also include an anti-collision component 160 mounted on a side of the fan main body 150, the anti-collision component 160 preventing the first fan $120_1$ from colliding with other adjacent fans, such as the second fan $120_2$ in FIG. 1. In FIG. 2, the anti-collision component 160 of the first fan $120_1$ may be, for example, arranged on a side 170 of the first fan $120_1$ opposite to the second fan $120_2$, such as arranged on an edge of the side 170. Four anti-collision members 160 disposed on the side 170 are shown in FIG. 2. The anti-collision members 160 may be made of, for example, an elastic material such as rubber. It should be understood that the number and location of the anti-collision members are merely illustrative of the present embodiment and are not intended to be limiting. The number and position of the anti-collision members can be modified.

To further describe position and function of the anti-collision component between two adjacent fans (such as the first fan $120_1$ and the second fan $120_2$), FIG. 3 illustrates a schematic diagram of an anti-collision component according to embodiments of the present disclosure. In FIG. 3, the first fan $120_1$ has four anti-collision components 160 on the side 170, and the second fan $120_2$ also has four anti-collision components 160 arranged at the same position on the side 180 opposite to the side 170. When the second fan $120_2$ moves towards the first fan $120_1$ along an arrow 310, the movement of the second fan $120_2$ along the arrow 310 is blocked, once the anti-collision components 160 of the second fan $120_2$ contact the anti-collision components 160 of the first fan $120_1$, i.e., the second fan $120_2$ is stationary at the position 320.

As described above, the electric motor 130 of the first fan $120_1$ may drive, based on the received signal, the first fan $120_1$ to change the position of the first fan $120_1$. Examples in this aspect will be described below by continuing to use the first fan $120_1$ as the example with reference to FIGS. 4A, 4B, 5A and 5B.

FIGS. 4A and 4B illustrate exemplary schematic diagrams of the movement of the fan according to embodiments of the present disclosure. As shown, a rotation shaft 131 of the electric motor 130 of the first fan $120_1$ is arranged on the guiding rail 110. As described above, when the signal connecting arrangement (not shown) receives a signal from the controller, the electric motor 130 may be driven to move the first fan 120₁ towards the disk assembly to be cooled. As shown in FIG. 4A, if the rotation shaft 131 of the electric motor 130 rotates, due to the received signal, on the guiding rail 110 in a direction 410 (counterclockwise), the first fan 120₁ moves in a direction 420. On the contrary, if the rotation shaft 131 of the electric motor 130 rotates, due to the received signal, on the guiding rail 110 in a direction 430, the first fan 120₁ moves in a direction 440 as shown in FIG. 4B.

Figure 5A:
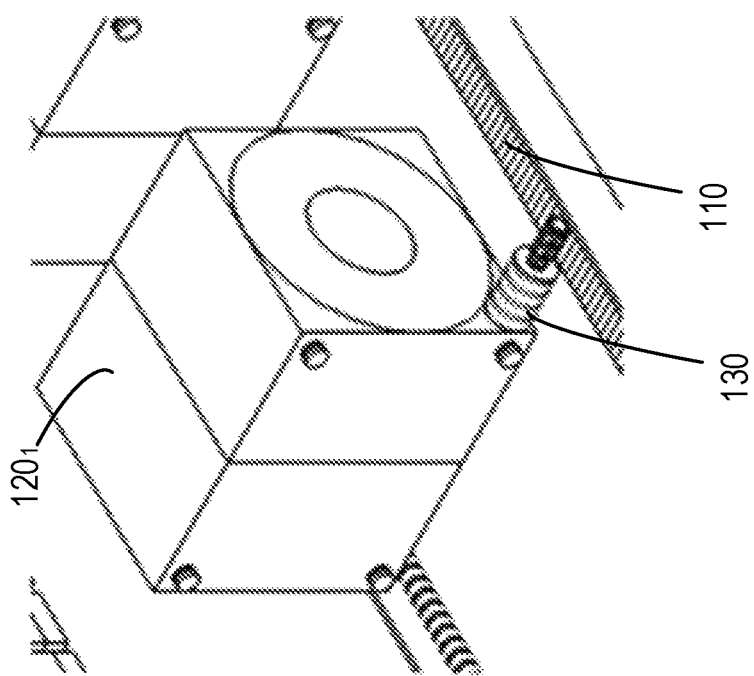
FIGS. 5A and 5B illustrate exemplary schematic diagrams of the movement of a fan according to embodiments of the present disclosure.
Figure 5B:
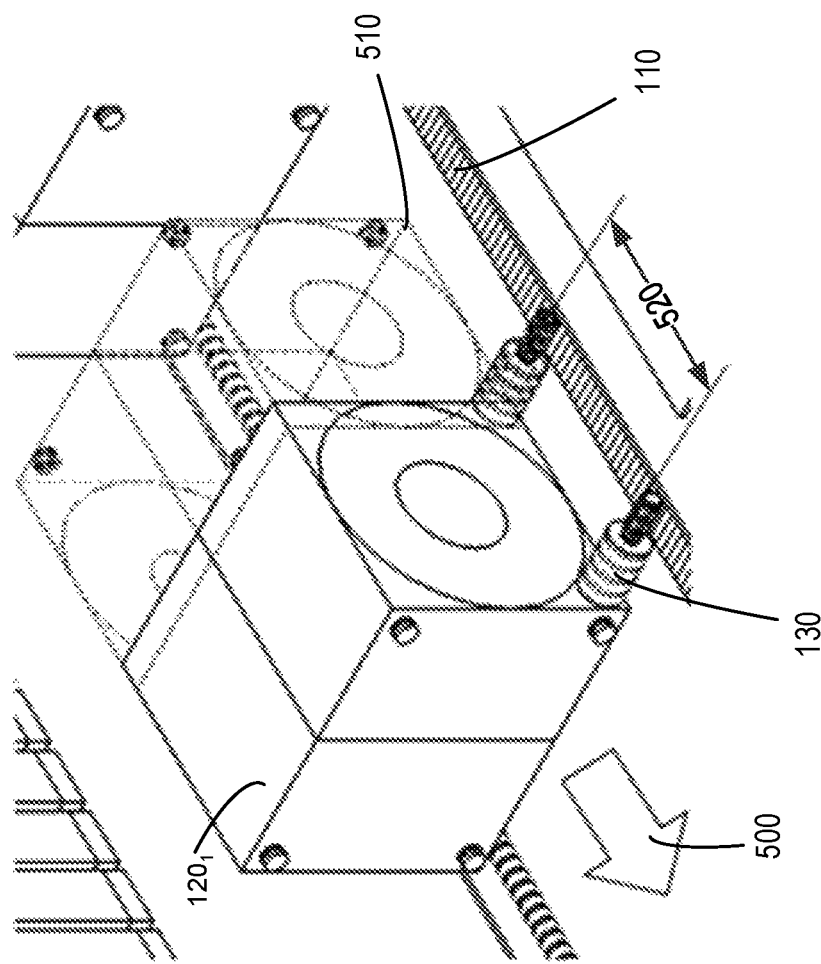

FIGS. 5A and 5B illustrate exemplary schematic diagrams of a fan being moved according to embodiments of the present disclosure. As shown in FIG. 5A, the first fan 120₁ is arranged on the guiding rail 110 and located at an initial position of the guiding rail. As described above, when the signal connecting arrangement (not shown) receives a signal from the controller, the electric motor 130 may be driven to move the first fan 120₁ towards the disk assembly to be cooled (along arrow 500). Particularly, in the embodiment where the electric motor 130 is a stepper motor, the control signal indicates a step number of the electric motor 130. The step number has a predetermined correspondence with the distance of the first fan 120₁ to be moved. For example, one step may equal to 5 mm (or any other suitable values). As shown in FIG. 5B, the current position of the first fan 120₁ moves a distance 520 compared with the initial position 510 (denoted by a dotted line) of the first fan 120₁.

Figure 6:
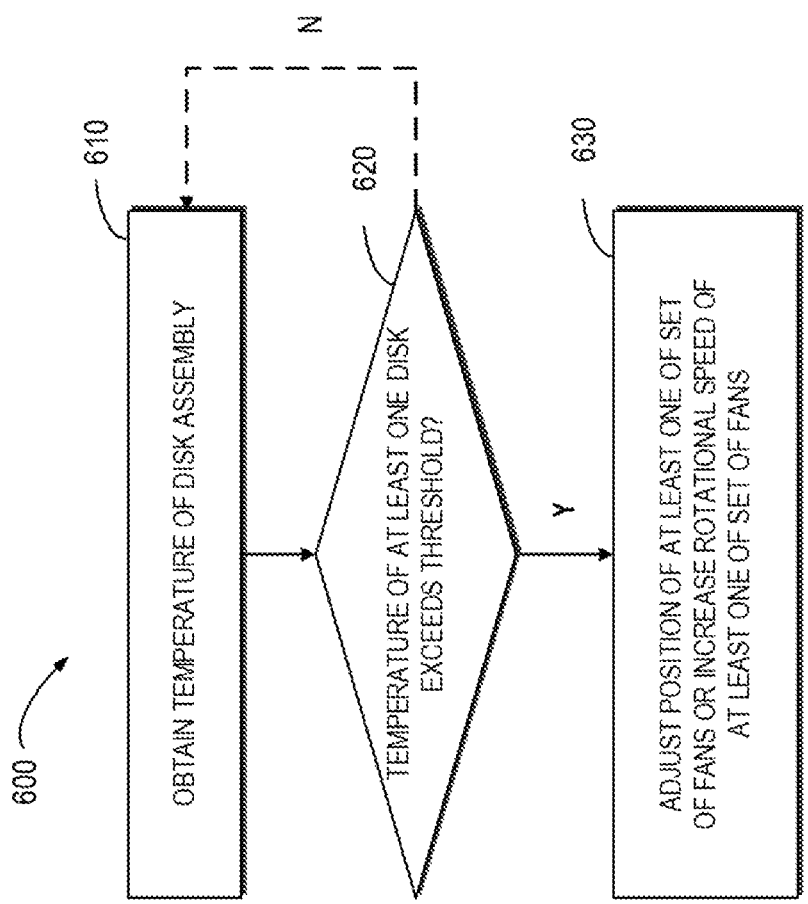
FIG. 6 illustrates an exemplary flowchart of a method for heat dissipation according to embodiments of the present disclosure.
Figure 8A:
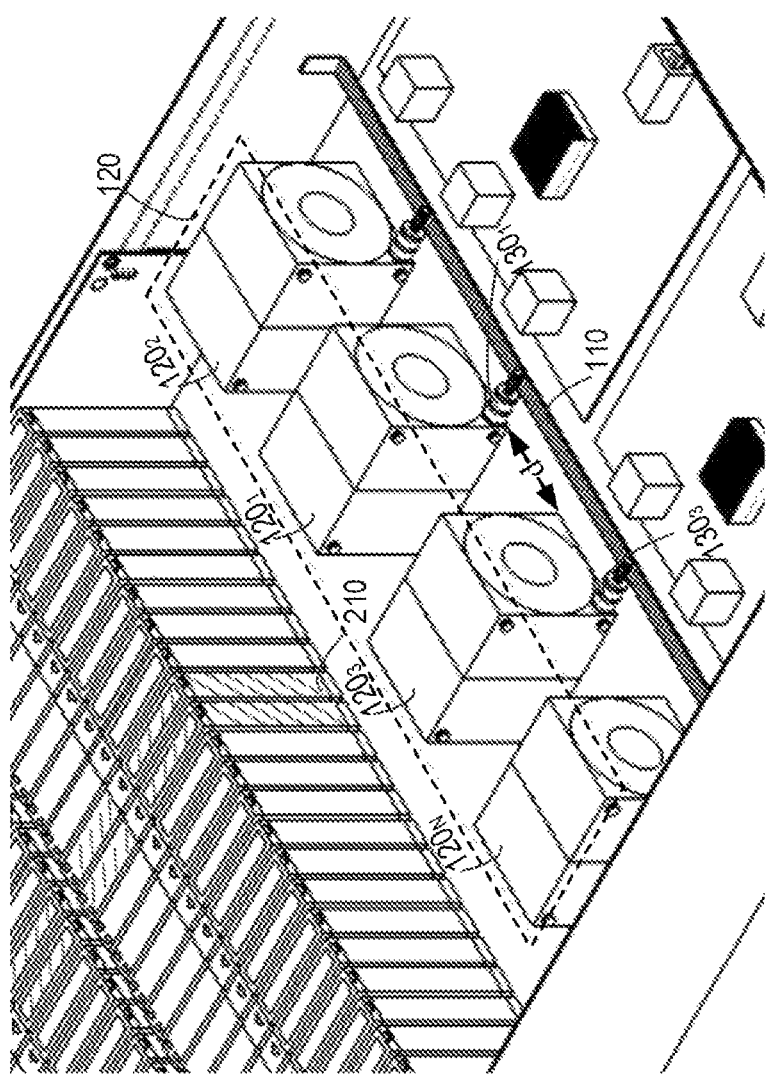
FIGS. 8A and 8B respectively illustrate exemplary schematic diagrams of a system for heat dissipation according to embodiments of the present disclosure.
Figure 8B:
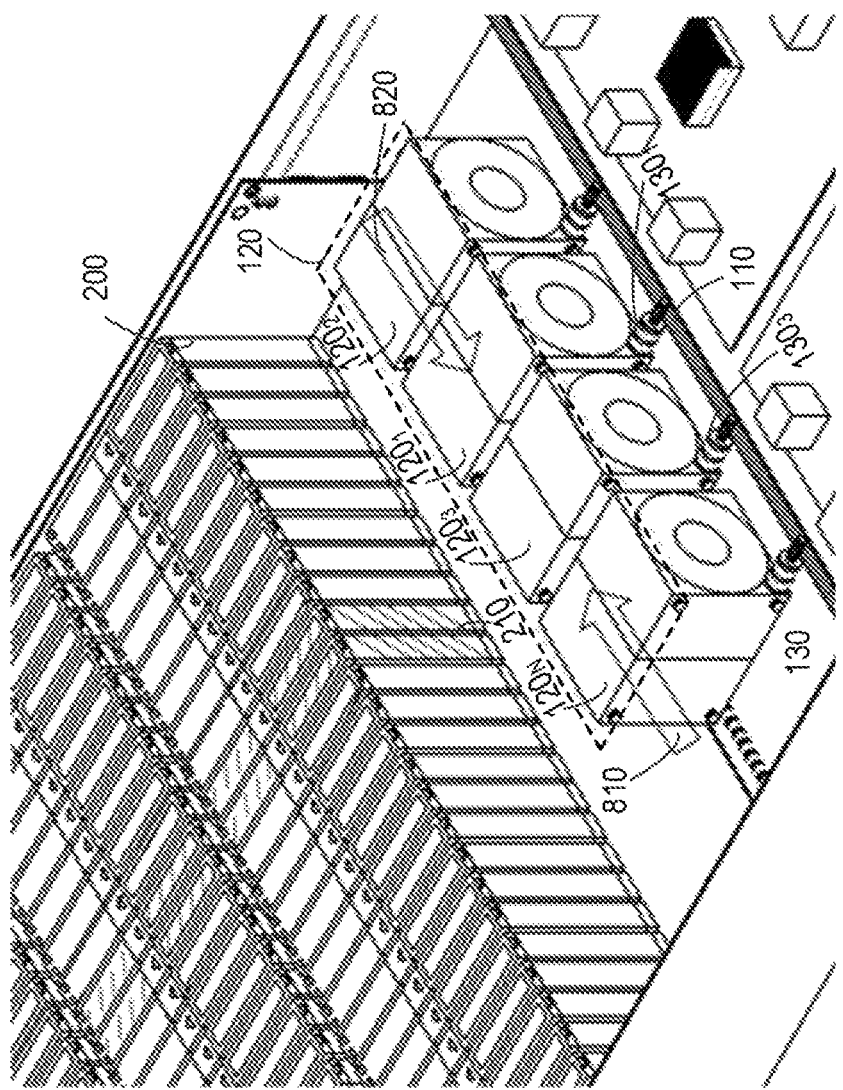

FIG. 6 illustrates an exemplary flowchart of method 600 for heat dissipation according to embodiments of the present disclosure. The method 600 of FIG. 6 will be described below by means of the system for heat dissipation shown in FIGS. 8A 8B. FIGS. 8A and 8B respectively illustrate exemplary schematic diagrams of the system for heat dissipation according to embodiments of the present disclosure. It should be understood that the system for heat dissipation shown by FIGS. 8A and 8B is only exemplary and is not intended for restricting the scope of the present disclosure.

In the example shown by FIG. 8A, a set of fans 120 in an initial state is arranged on the guiding rail 110 and configured to move towards the direct heat generated by the disk assembly 200 to cool the disk assembly 200. After the disk assembly 200 of the storage device has run for a while, heat dissipation can be performed on the storage device.

At 610, the controller obtains the temperature of the disk assembly 200 at a first time point. The temperature is obtained, for example, by polling the temperature of the disk assembly 200.

At 620, the controller determines whether at least one disk has a temperature exceeding a threshold temperature. If at least one disk (e.g., disk 210 in FIG. 8A) in the disk assembly 200 has a temperature exceeding a threshold temperature, at 630, the controller adjusts the position of at least one of the set of fans 120 or increases the rotational speed of at least one of the set of fans 120.

In the example shown in FIG. 8A, at least one fan may be any one or more of the first fan 120₁, the second fan 120₂, the third fan 120₃ and the fourth fan 120ₙ of the set of fans 120 shown in FIG. 8A.

In some embodiments, the controller which adjusts the position of the first fan 120₁ may include the controller also driving the electric motor 130₁ mounted on the first fan 120₁ by transmitting the control signal to the first fan 120₁, such that the first fan 120₁ is driven towards the at least one disk (e.g., disk 210 in FIG. 8A) having a temperature exceeding the threshold temperature. In the example shown in FIG. 8B, the first fan 120₁ may be, for example, driven towards the disk in a direction 820.

In some embodiments, if there is no disk in the disk assembly 200 having a temperature exceeding a threshold temperature, the method 600 goes back to 610, and the controller obtains the temperature of the disk assembly at a further time point.

Additionally or alternatively, in some embodiments, after obtaining the temperature of the disk assembly at 610, if the controller determines that a plurality of disk assemblies (e.g., more than one disk assembly) have the temperatures exceeding the threshold temperature, the rotational speed of at least one of, at least a part of or the full set of fans 120 can be increased.

Figure 7:
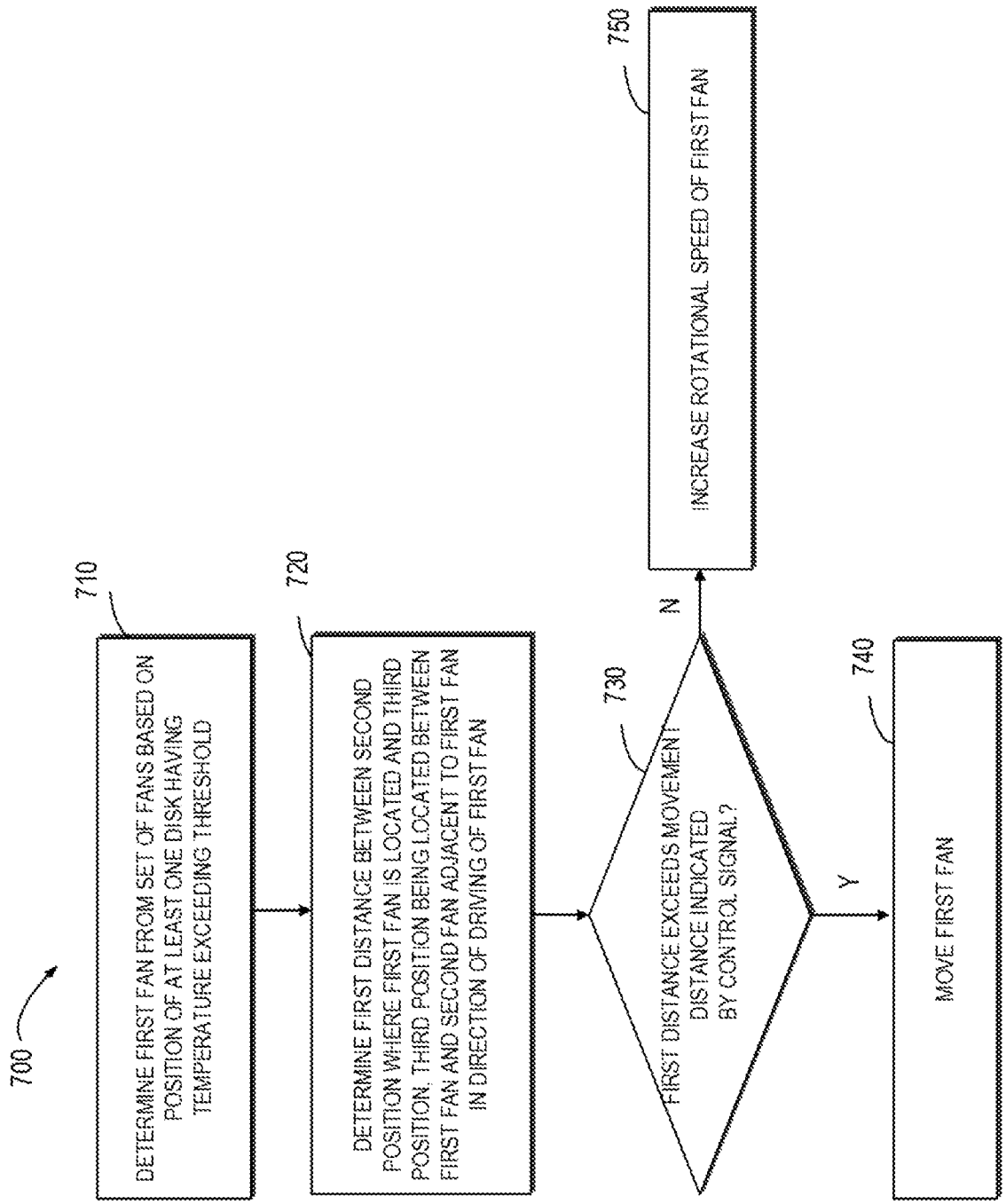
FIG. 7 illustrates an exemplary flowchart of a method for heat dissipation according to embodiments of the present disclosure.

FIG. 7 illustrates an exemplary flowchart of a method for heat dissipation 700 according to embodiments of the present disclosure. It should be understood that the method 700 shown in FIG. 7 is a specific implementation of the method for heat dissipation 600 shown in FIG. 6, and the method 700 is only exemplary instead of restrictive.

At 710, the controller determines, based on the position of the at least one disk having the temperature exceeding the threshold, a fan to be moved from the set of fans. The disk/disks having the temperature exceeding the threshold may be, for example, determined at 620 of the method 600 and the determination process will not be repeated here.

According to embodiments of the present disclosure, the fan to be moved may be determined from a set of fans in various ways. The embodiment of determination will be described below by means of the example of FIG. 8A. According to FIG. 8A, when the controller determines the disk 210 having a temperature exceeding the threshold temperature, based on the position of the disk 210, a fan closest to the disk 210 may be selected as the fan to be moved.

It should be understood that the fan to be moved may include one or more fans, for example, selecting a fan closest to the disk 210 on the right side, e.g., the first fan 120₁, or selecting a fan closest to the disk 210 on the left side, such as the third fan 120₃. Both the fan closest to the disk 210 on the right side and the fan closest to the disk 210 on the left side may be selected as the fans to be moved if needed, to move them simultaneously.

Once the fan to be moved is determined, at 720, the controller determines the position of the first fan 120₁ and a distance of the first fan 120₁ to other adjacent fans in the movement direction.

As described above, the first fan 120₁ is the fan closest to the disk 210 on the right side, which means the first fan 120₁ should be moved to the left (in a direction 820 of FIG. 8B). In the example shown in FIG. 8A, a distance d of the first fan 120₁ to the adjacent third fan 120₃ is determined.

After the distance d is determined, at 730, the controller determines whether the distance d exceeds a movement distance of the first fan 120₁. If the controller determines that the distance d exceeds a movement distance of the first fan 120₁, at 740, the first fan 120₁ is moved. If the controller determines that the distance d does not exceed a movement distance of the first fan 120₁, at 750, the rotational speed of the first fan 120₁ is increased.

If the fan closest to the disk 210 on the left side, e.g., the third fan 120₃, is selected as the fan to be moved, a distance of the third fan 120₃ to its adjacent fans in the direction 810 will be determined. The rest actions are identical to the above procedure.

Since the process in which the electric motor 130 is mounted on the first fan 120₁ to drive the movement of the first fan 120₁ in response to the control signal has been described by taking the first fan 120₁ as the example, no further description is provided in this section.

Although not shown in the flowchart 700 of FIG. 7, the method for dissipating heat of the storage device according to embodiments of the present disclosure may also obtain the temperature of the disk assembly again at the subsequent time points after the block 740 of FIG. 7 in some embodiments. If the temperature of the at least one disk (e.g., disk 210) still extends beyond the threshold temperature, the rotational speed of the fan (such as first fan 120₁) that has already been moved can be increased, or the rotational speed of other or all fans in the set of fans 120 may also be increased.

Various embodiments of the present disclosure have been described above and the above description is only exemplary rather than exhaustive and is not limited to the embodiments of the present disclosure. Many modifications and alterations, without deviating from the scope and spirit of the explained various embodiments, are obvious for those skilled in the art. The selection of terms in the text aims to best explain principles and actual applications of each embodiment and technical improvements made in the market by each embodiment, or enable others having ordinary skill in the art to understand embodiments of the present disclosure.

We claim:

1. A system for heat dissipation of a storage device, comprising:
    a guiding rail mounted in an enclosure of the storage device;
    a set of fans arranged on the guiding rail and being movable in a lateral direction on the guiding rail, the lateral direction being parallel to a longitudinal axis of the guiding rail, the set of fans being configured to dissipate the heat of a disk assembly of the storage device; and
    a controller configured to:
        obtain a temperature of the disk assembly at a first time point;
        in response to the temperature of at least one disk in the disk assembly exceeding a threshold temperature, adjust a position of at least one of the set of fans by laterally moving the at least one of the set of fans on the guiding rail towards the at least one disk having the temperature exceeding the threshold temperature; and
        determine a first fan from the set of fans to move on the guiding rail as part of the adjusting based on a first distance between a current position of the first fan and a position of the at least one disk having the temperature exceeding the threshold temperature being less than a predetermined distance;
    wherein the at least one fan has an electric motor mounted thereon, the electric motor having a rotation shaft rotatable on the guiding rail and being configured to drive, in response to receiving a control signal from the controller, the at least one fan on the guiding rail towards the at least one disk having the temperature exceeding the threshold temperature.

2. The system of claim 1, wherein the controller is further configured to:
    determine a second distance between the current position of the first fan and another position between the first fan and a second fan adjacent to the first fan in a direction of driving the first fan; and
    in response to the second distance exceeding a movement distance indicated by the control signal, move the first fan.

3. The system of claim 2, wherein the controller is further configured to:
    in response to the second distance being less than the movement distance indicated by the control signal, increase a rotational speed of the first fan.

4. The system of claim 2, wherein the controller is further configured to:
    obtain a temperature of the disk assembly at a second time point, the second time point being later than the first time point; and
    in response to the temperature of the at least one disk still exceeding the threshold temperature, increase a rotational speed of the first fan.

5. The system of claim 1, wherein the controller is further configured to:
    in response to a temperature of more than one disk in the disk assembly exceeding the threshold temperature, increase a rotational speed of at least one of the set of fans.

6. The system of claim 1, wherein at least one anti-collision component is provided on opposite sides of adjacent fans in the set of fans.

7. A method for heat dissipation of a storage device, comprising:
    obtaining a temperature of a disk assembly of the storage device at a first time point; and
    in response to the temperature of at least one disk in the disk assembly exceeding a threshold temperature, adjusting a position of at least one of the set of fans;
    wherein the set of fans are arranged on a guiding rail mounted in an enclosure of the storage device and are movable in a lateral direction on the guiding rail, the lateral direction being parallel to a longitudinal axis of the guiding rail, the set of fans being configured to dissipate the heat of the disk assembly of the storage device;
    wherein adjusting a position of at least one of the set of fans comprises transmitting a control signal to the at least one fan to drive an electric motor mounted on the at least one fan, such that the at least one fan laterally moves on the guiding rail towards the at least one disk having the temperature exceeding the threshold temperature; and
    wherein the driving comprises determining a first fan from the set of fans to move on the guiding rail as part of the adjusting based on a first distance between a current position of the first fan and a position of the at least one disk having the temperature exceeding the threshold temperature being less than a predetermined distance.

8. The method of claim 7, further comprising:
    determining a second distance between the current position of the first fan and another position between the first fan and a second fan adjacent to the first fan in a direction of driving the first fan; and
    in response to the second distance exceeding a movement distance indicated by the control signal, moving the first fan.

9. The method of claim 8, further comprising:
    in response to the second distance being less than the movement distance indicated by the control signal, increasing a rotational speed of the first fan.

10. The method of claim 8, further comprising:
obtaining a temperature of the disk assembly at a second time point, the second time point being later than the first time point; and
in response to the temperature of the at least one disk still exceeding the threshold temperature, increasing a rotational speed of the first fan.

11. The method of claim 7, further comprising:
in response to a temperature of more than one disk in the disk assembly exceeding the threshold temperature, increasing a rotational speed of at least one of the set of fans.

12. The method of claim 7, wherein at least one anti-collision component is provided on opposite sides of adjacent fans in the set of fans.

13. The method of claim 7, wherein the adjusting further comprises laterally moving the at least one fan towards one side of the at least one disk having the temperature exceeding the threshold temperature, and laterally moving at least one other fan of the set of fans towards another side of the at least one disk having the temperature exceeding the threshold temperature.

14. A computer program product comprising a non-transitory processor-readable storage medium having stored therein program code of one or more software programs for heat dissipation of a storage device, wherein the program code, when executed by at least one processing device comprising a processor coupled to a memory, causes said at least one processing device to perform the actions of:
obtaining a temperature of a disk assembly of the storage device at a first time point; and
in response to the temperature of at least one disk in the disk assembly exceeding a threshold temperature, adjusting a position of at least one of the set of fans;
wherein the set of fans are arranged on a guiding rail mounted in an enclosure of the storage device and are movable in a lateral direction on the guiding rail, the lateral direction being parallel to a longitudinal axis of the guiding rail, the set of fans being configured to dissipate the heat of the disk assembly of the storage device;
wherein adjusting a position of at least one of the set of fans comprises transmitting a control signal to the at least one fan to drive an electric motor mounted on the at least one fan, such that the at least one fan laterally moves on the guiding rail towards the at least one disk having the temperature exceeding the threshold temperature; and
wherein the driving comprises determining a first fan from the set of fans to move on the guiding rail as part of the adjusting based on a first distance between a current position of the first fan and a position of the at least one disk having the temperature exceeding the threshold temperature being less than a predetermined distance.

15. The computer program product of claim 14 wherein the program code when executed by the at least one processing device further causes the at least one processing device to perform the actions of:
determining a second distance between the current position of the first fan and another position between the first fan and a second fan adjacent to the first fan in a direction of driving the first fan; and
in response to the second distance exceeding a movement distance indicated by the control signal, moving the first fan.

16. The computer program product of claim 15, wherein the program code when executed by the at least one processing device further causes the at least one processing device to perform the action of:
in response to the second distance being less than the movement distance indicated by the control signal, increasing a rotational speed of the first fan.

17. The computer program product of claim 15, wherein the program code when executed by the at least one processing device further causes the at least one processing device to perform the actions of:
obtaining a temperature of the disk assembly at a second time point, the second time point being later than the first time point; and
in response to the temperature of the at least one disk still exceeding the threshold temperature, increasing a rotational speed of the first fan.

18. The computer program product of claim 14, wherein the program code when executed by the at least one processing device further causes the at least one processing device to perform the action of:
in response to a temperature of more than one disk in the disk assembly exceeding the threshold temperature, increasing a rotational speed of at least one of the set of fans.

19. The computer program product of claim 14, wherein at least one anti-collision component is provided on opposite sides of adjacent fans in the set of fans.

20. The computer program product of claim 14, wherein the adjusting further comprises laterally moving the at least one fan towards one side of the at least one disk having the temperature exceeding the threshold temperature, and laterally moving at least one other fan of the set of fans towards another side of the at least one disk having the temperature exceeding the threshold temperature.

* * * * *